(12) United States Patent
Yoo et al.

(10) Patent No.: US 11,791,282 B2
(45) Date of Patent: Oct. 17, 2023

(54) SEMICONDUCTOR PACKAGE INCLUDING PART OF UNDERFILL ON PORTION OF A MOLDING MATERIAL SURROUNDING SIDES OF LOGIC CHIP AND MEMORY STACK ON INTERPOSER AND METHOD FOR MANUFACTURING THE SAME

(71) Applicant: Samsung Electronics Co., Ltd., Suwon-si (KR)

(72) Inventors: Jaekyung Yoo, Seoul (KR); Yeongkwon Ko, Hwaseong-si (KR); Jayeon Lee, Seongnam-si (KR); Jaeeun Lee, Hwaseong-si (KR); Teakhoon Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 67 days.

(21) Appl. No.: 17/083,932

(22) Filed: Oct. 29, 2020

(65) Prior Publication Data
US 2022/0013474 A1 Jan. 13, 2022

(30) Foreign Application Priority Data

Jul. 10, 2020 (KR) .......................... 10-2020-0085061

(51) Int. Cl.
| | |
|---|---|
| H01L 21/768 | (2006.01) |
| H01L 23/522 | (2006.01) |
| H01L 23/00 | (2006.01) |
| H01L 23/31 | (2006.01) |
| H01L 23/495 | (2006.01) |
| H01L 23/528 | (2006.01) |

(Continued)

(52) U.S. Cl.
CPC ........ *H01L 23/562* (2013.01); *H01L 21/4853* (2013.01); *H01L 21/563* (2013.01); *H01L 21/565* (2013.01); *H01L 23/3128* (2013.01); *H01L 23/49833* (2013.01); *H01L 25/0652* (2013.01); *H01L 25/18* (2013.01); *H01L 25/50* (2013.01)

(58) Field of Classification Search
CPC . H01L 23/562; H01L 21/4853; H01L 21/563; H01L 21/565; H01L 23/3128; H01L 23/293; H01L 24/97; H01L 25/0657; H01L 25/0655; H01L 23/5386; H01L 23/5389; H01L 23/31; H01L 23/315; H01L 25/042
See application file for complete search history.

(56) References Cited

U.S. PATENT DOCUMENTS

| | | | |
|---|---|---|---|
| 6,011,301 A * | 1/2000 | Chiu | H01L 29/0657 257/E29.022 |
| 6,049,124 A | 4/2000 | Raiser et al. | |

(Continued)

*Primary Examiner* — Marcos D. Pizarro
*Assistant Examiner* — Tenley H Schofield
(74) *Attorney, Agent, or Firm* — Harness, Dickey & Pierce, P.L.C.

(57) ABSTRACT

A semiconductor package comprises a substrate; an interposer on the substrate; a first underfill between the substrate and the interposer; at least one logic chip and at least one memory stack on the interposer; and a molding material on the interposer while surrounding a side surface of the at least one logic chip and a side surface of the at least one memory stack. The molding material includes areas having different heights. The first underfill covers a portion of the molding material.

16 Claims, 14 Drawing Sheets

(51) Int. Cl.
  *H01L 23/532*   (2006.01)
  *H01L 25/065*   (2023.01)
  *H01L 25/18*    (2023.01)
  *H01L 25/00*    (2006.01)
  *H01L 21/48*    (2006.01)
  *H01L 21/56*    (2006.01)
  *H01L 23/498*   (2006.01)

(56) References Cited

U.S. PATENT DOCUMENTS

| | | |
|---|---|---|
| 6,580,152 B2 | 6/2003 | Hasegawa |
| 7,638,362 B2 | 12/2009 | Ishino et al. |
| 8,486,756 B2 | 7/2013 | Masuda et al. |
| 8,581,402 B2 | 11/2013 | Yu et al. |
| 8,796,864 B2 | 8/2014 | Masuda et al. |
| 8,836,097 B2 | 9/2014 | Yang et al. |
| 9,496,193 B1* | 11/2016 | Roesner ............... H01L 24/32 |
| 9,589,861 B2 | 3/2017 | Huang et al. |
| 2003/0077852 A1* | 4/2003 | Master ............... H05K 3/3478 438/106 |
| 2006/0220195 A1* | 10/2006 | Sane ............... H01L 21/563 257/676 |
| 2008/0088011 A1* | 4/2008 | Hu ............... H01L 21/568 257/E23.024 |
| 2009/0200684 A1* | 8/2009 | Masuda ............... H01L 21/563 257/E21.511 |
| 2015/0069623 A1* | 3/2015 | Tsai ............... H01L 21/76802 257/774 |
| 2017/0084596 A1* | 3/2017 | Scanlan ............... H01L 21/561 |
| 2017/0256432 A1 | 9/2017 | Burmeister et al. |
| 2018/0138151 A1* | 5/2018 | Shih ............... H01L 25/074 |
| 2021/0066211 A1* | 3/2021 | Tsai ............... H01L 24/20 |
| 2021/0151407 A1* | 5/2021 | Liu ............... H01L 25/03 |
| 2021/0183844 A1* | 6/2021 | Cheng ............... H01L 23/5389 |
| 2021/0296194 A1* | 9/2021 | Shah ............... H01L 21/6836 |
| 2021/0407887 A1* | 12/2021 | Yu ............... H01L 23/04 |

\* cited by examiner

SEMICONDUCTOR PACKAGE INCLUDING PART OF UNDERFILL ON PORTION OF A MOLDING MATERIAL SURROUNDING SIDES OF LOGIC CHIP AND MEMORY STACK ON INTERPOSER AND METHOD FOR MANUFACTURING THE SAME

CROSS-REFERENCE TO THE RELATED APPLICATION

This application claims priority from Korean Patent Application No. 10-2020-0085061, filed on Jul. 10, 2020, in the Korean Intellectual Property Office, the disclosure of which is incorporated herein by reference in its entirety.

BACKGROUND

1. Field

The example embodiments of the disclosure relate to a semiconductor package and a method for manufacturing the same.

2. Description of Related Art

For next-generation high-performance communication appliances, a semiconductor package having a logic device and memory devices, which have a high bandwidth memory (HBM), are being highlighted. Such a semiconductor package may include an interposer mounted on a substrate, and a logic chip and a plurality of memory stacks mounted on the interposer.

In particular, semiconductor packages designed to be suitable for mobile communication are manufactured to be thin and, as such, may be very weak against external physical stress such as warpage.

SUMMARY

The example embodiments of the disclosure provide a semiconductor package in which generation of cracks between internal devices is minimized, and a method for manufacturing the same.

According to an embodiment, a semiconductor package includes a substrate; an interposer on the substrate; a first underfill between the substrate and the interposer; at least one logic chip and at least one memory stack on the interposer; and a molding material on the interposer while surrounding a side surface of the at least one logic chip and a side surface of the at least one memory stack. The molding material includes areas having different heights. The first underfill covers a portion of the molding material.

According to an embodiment, a semiconductor package includes at least one logic chip and a plurality of memory stacks; a molding material surrounding side surfaces of the at least one logic chip and the plurality of memory stacks; and an underfill surrounding a periphery of the molding material while overlapping with a portion of the molding material. The molding material includes a reference area and at least one recess area. The reference area includes a portion having a maximum height. A height of the at least one recess area is lower than the maximum height of the portion of the reference area. When viewed in a plane, the molding material includes a plurality of sides and a plurality of edges. Each of the plurality of edges are defined by two adjacent ones of the plurality of sides. The at least one recess area includes the plurality of edges.

According to an embodiment, a semiconductor package includes a substrate; an interposer on the substrate; an underfill between the substrate and the interposer; a logic chip on the interposer, a first memory stack and a second memory stack on the interposer, and a molding material on the interposer while surrounding side surfaces of the logic chip, the first memory stack, and the second memory stack. The first memory stack and the second memory stack are disposed symmetrically with respect to the logic chip while being disposed in parallel. The molding material includes a reference area, a first recess area and a second recess area, which have heights lower than a height of the reference area. The underfill overlaps the first recess area and the second recess area on a side surface of the molding material and on the first recess area and the second recess area. A height of the underfill is higher than the height of the first recess area and lower than the height of the reference area.

According to an embodiment, a method for manufacturing a semiconductor package includes forming at least one logic chip and a plurality of memory stacks on an interposer; coating an uncured molding material on the interposer; curing the uncured molding material to provide a cured molding material; forming, at the cured molding material, areas having different heights through a process of removing a portion of the cured molding material; mounting the interposer on a substrate; and forming an underfill between the substrate and the interposer, on an outside of a periphery of the cured molding material, and on a part of the areas of the cured molding material.

Example embodiments of the disclosure provide a semiconductor package having a structure capable of reducing effective stress formed in a horizontal direction between a molding material and an underfill, and/or a method for manufacturing the same.

DETAILED DESCRIPTION OF EXAMPLE EMBODIMENTS

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
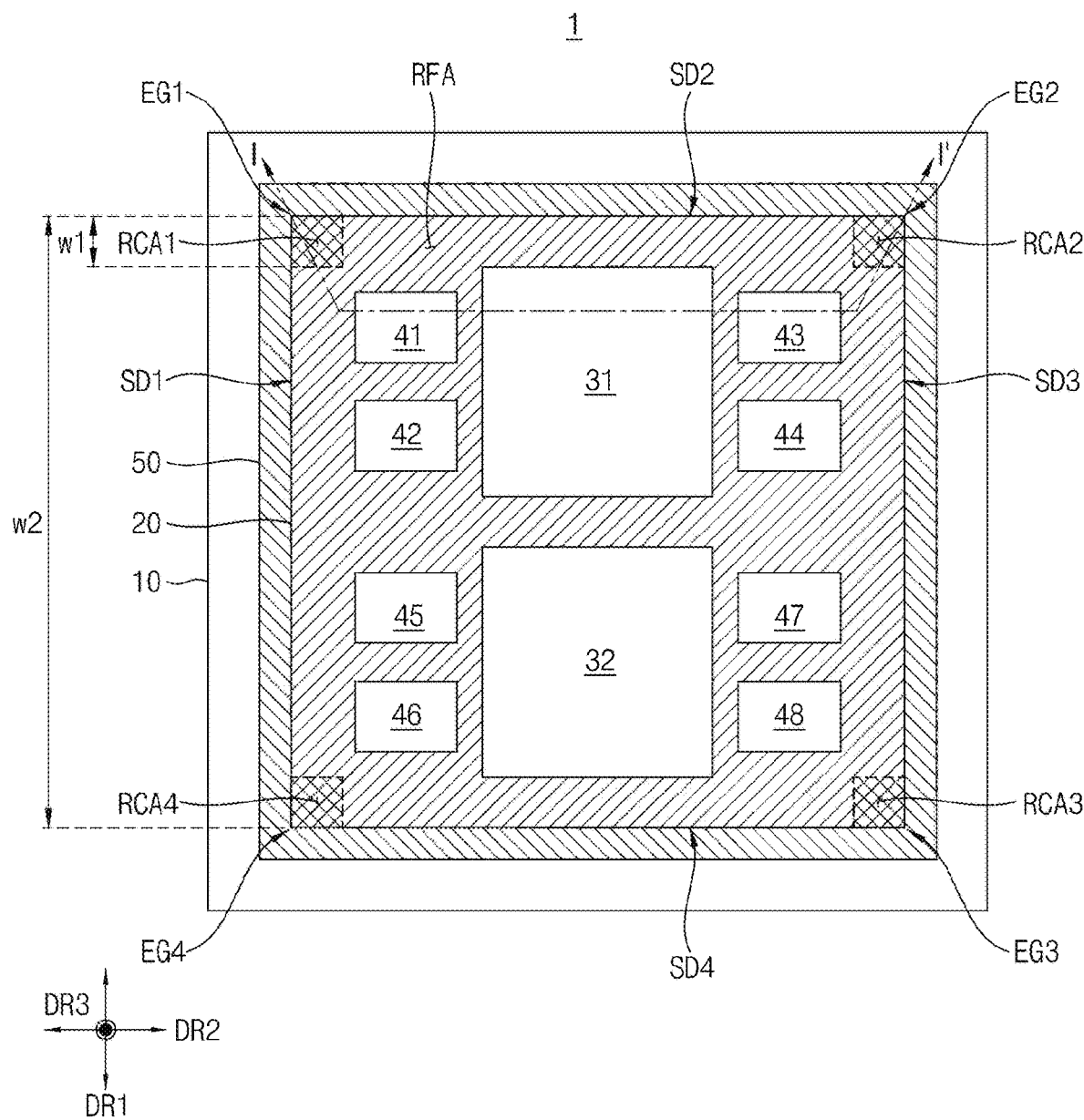
FIG. 1 is a projected top view schematically showing a semiconductor package according to an example embodiment of the disclosure.
Figure 2:
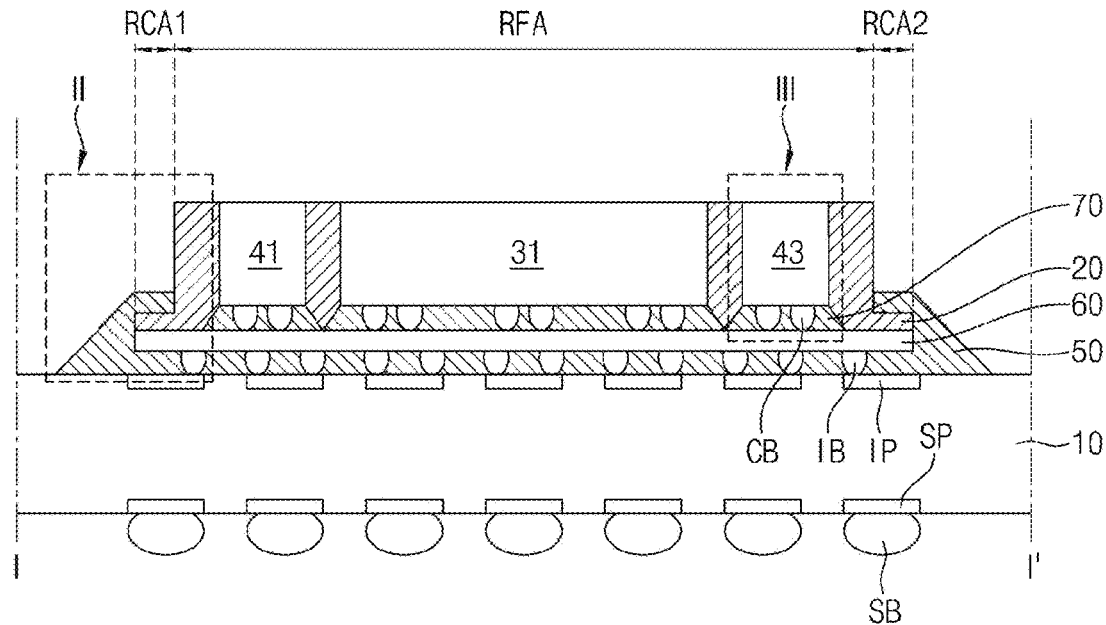
FIG. 2 is a schematic cross-sectional view of the semiconductor package taken along line I-I' in FIG. 1.
Figure 3:
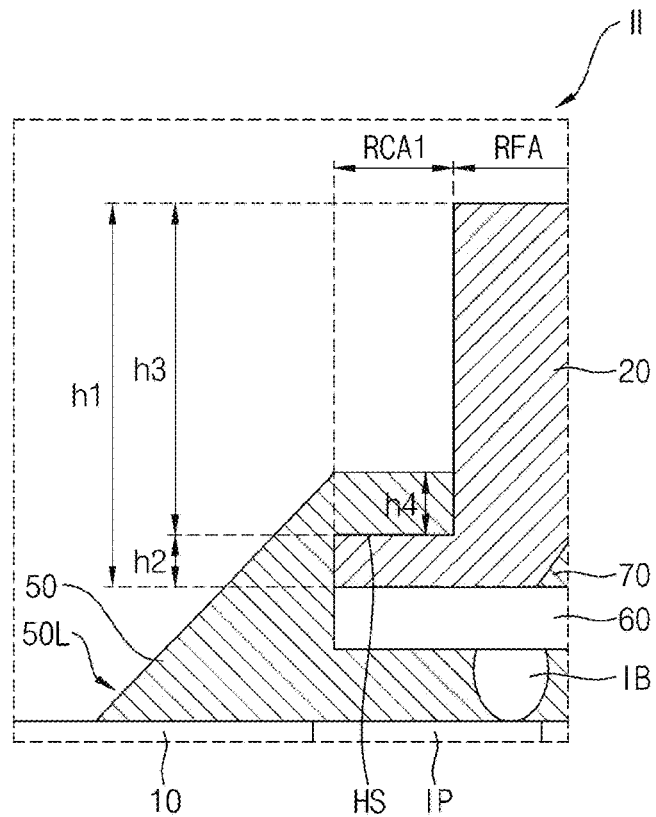
FIG. 3 is an enlarged view of area II in FIG. 2.
Figure 4:
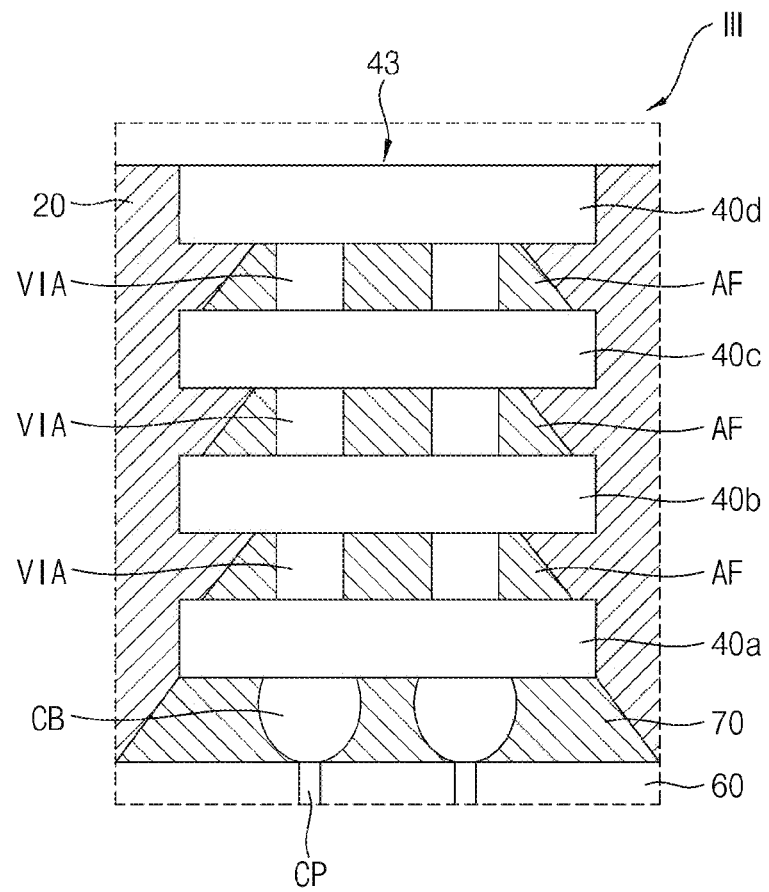
FIG. 4 is an enlarged view of area III in FIG. 2.
Figure 5:
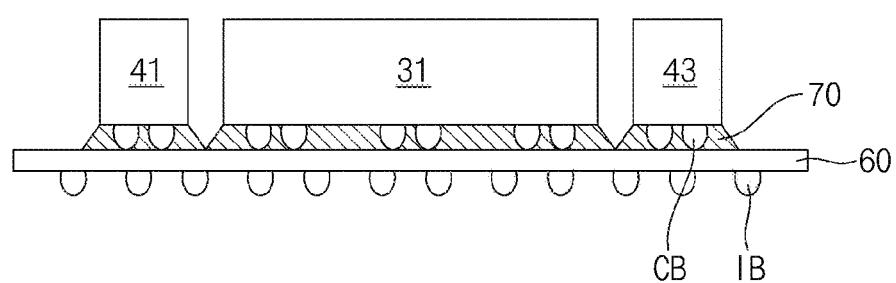
FIGS. 5 to 9 are sectional views schematically showing a method of manufacturing a semiconductor package in accordance with an example embodiment of the disclosure.
Figure 6:
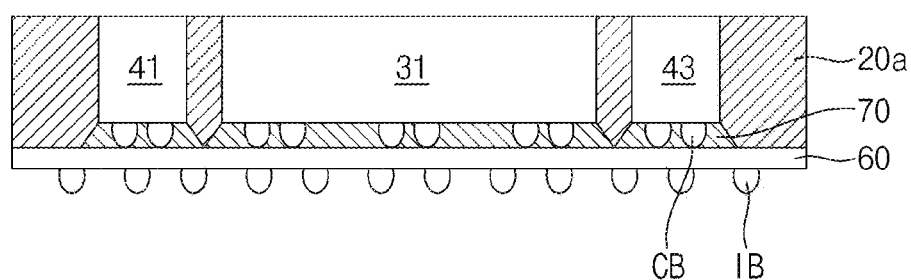

FIG. 1 is a projected top view schematically showing a semiconductor package according to an example embodiment of the disclosure. FIG. 2 is a schematic cross-sectional view of the semiconductor package taken along line I-I' in FIG. 1. FIG. 3 is an enlarged view of area II in FIG. 2. FIG. 4 is an enlarged view of area III in FIG. 2.

Referring to FIG. 1, a semiconductor package 1 includes a substrate 10, one or more logic chips 31 and 32, one or more memory stacks 41 to 48, which are disposed on the substrate 10, and a molding material 20 and a first underfill 50, which surround the logic chips 31 and 32 and the memory stacks 41 to 48. An upward direction of the semiconductor package 1 is referred to as a "third direction DR3". For convenience of description, when viewed in FIG. 1, a first direction DR1 is defined as representing an upward or downward direction, and a second direction DR2 is defined as representing a left or right direction, and the third direction DR3 is defined as representing a direction normal to a plane defined by the first direction DR1 and the second direction DR2. Of course, it may be appreciated that the first direction DR1, the second direction DR2 and the third direction DR3 cross one another, without being limited to the above-described definitions.

The substrate 10 may be a base member of the semiconductor package 1. The substrate 10 may be selected from a printed circuit board (PCB), a flexible printed circuit board (FPCB), a silicon-based substrate, a ceramic substrate, a glass substrate, and an insulating circuit board. In an embodiment, the substrate 10 may be a printed circuit board or a flexible printed circuit board.

In an embodiment, the semiconductor package 1 may include a first logic chip 31 and a second logic chip 32. The first logic chip 31 and the second logic chip 32 may be disposed side-by-side in the first direction DR1 such that the first logic chip 31 and the second logic chip 32 are disposed adjacent to each other on the substrate 10. Each of the first logic chip 31 and the second logic chip 32 may include one of a core processor, an application specific integrated circuit (ASIC), a mobile application processor (AP) and other processing chips. The first logic chip 31 and the second logic chip 32 may be disposed at horizontally the same level.

In an embodiment, the semiconductor package 1 may include first to eighth memory stacks 41 to 48. The first to fourth memory stacks 41 to 44 may be disposed side-by-side with respect to the first logic chip 31 in the second direction DR2 crossing the first direction DR1. The fifth to eighth memory stacks 45 to 48 may be disposed side-by-side with respect to the second logic chip 32 in the second direction DR2.

In some embodiments, the first to fourth memory stacks 41 to 48 may include stacks of interconnected semiconductor chips (e.g., DRAM). In some embodiments, the semiconductor package 1 (and semiconductor packages 1-1, 1-2, 1-3, 1-4, 2, 3, and 4 described in FIGS. 10 to 16) may comply with a High Bandwidth Memory (HBM) standard released by JEDEC (Joint Electron Device Engineering Council), as well as future evolutions/versions of HBM standards.

In accordance with embodiments, the first to fourth memory stacks 41 to 44 may be symmetrically disposed at opposite sides of the first logic chip 31 in the second direction DR2 while being disposed in parallel.

For example, the first and second memory stacks 41 and 42 may be disposed adjacent to one side surface (left in the drawing) of the first logic chip 31. The third and fourth memory stacks 43 and 44 may be disposed adjacent to the other side surface (right in the drawing) of the first logic chip 31. The first and second memory stacks 41 and 42 may be aligned with each other in the first direction DR1 while being disposed side-by-side in the first direction DR1. Similarly, the third and fourth memory stacks 43 and 44 may be aligned with each other in the first direction DR1 while being disposed side-by-side in the first direction DR1.

For example, the fifth and sixth memory stacks 45 and 46 may be disposed adjacent to one side surface (left in the drawing) of the second logic chip 32. The seventh and eighth memory stacks 47 and 48 may be disposed adjacent to the other side surface (right in the drawing) of the second logic chip 32. The fifth and sixth memory stacks 45 and 46 may be aligned with each other in the first direction DR1 while being disposed side-by-side in the first direction DR1. Similarly, the seventh and eighth memory stacks 47 and 48 may be aligned with each other in the first direction DR1 while being disposed side-by-side in the first direction DR1.

The logic chips 31 and 32 may be disposed to be very closely adjacent to each other. The first logic chip 31 and the second logic chip 32 may be spaced apart from each other or adjacent to each other by a distance of about 0.04 to 0.08 mm. In an example embodiment, the distance between the first logic chip 31 and the second logic chip 32 may be about 0.06 mm.

For example, the minimum distance between the logic chips 31 and 32 may be smaller than the minimum distance between the logic chips 31 and 32 and the memory stacks 41 to 48. The logic chips 31 and 32 and the memory stacks 41 to 48 may be spaced apart from each other or adjacent to each other by a distance of about 0.5 to 0.9 mm. In an example embodiment, the distance between the logic chips 31 and 32 and the memory stacks 41 to 48 may be about 0.7 mm.

The molding material 20 may surround side surfaces of the logic chips 31 and 32 and the memory stacks 41 to 48. The molding material 20 may fill spaces among the logic chips 31 and 32 and the memory stacks 41 to 48. Each upper surface of the logic chips 31 and 32 and the memory stacks 41 to 48 may be exposed without being covered by the molding material 20. In accordance with embodiments, the height of the upper surfaces of the logic chips 31 and 32 and the memory stacks 41 to 48 may be equal to the height of the uppermost surface of the molding material 20. The molding material 20 may include an epoxy molding compound (EMC).

In an embodiment, the periphery of the molding material 20 may have a planar quadrangular shape. The molding material 20 may include, at the planar periphery, four sides SD1 to SD4, and four edges EG1 to EG4 each defined by a point where two adjacent ones of the four sides SD1 to SD4 meet. For example, the molding material 20 may include a first side SD1 and a third side SD3, which are disposed in parallel in the first direction DR1 while extending in the first direction DR1, and a second side SD2 and a fourth side SD4, which are disposed in parallel in the second direction DR2 while extending in the second direction DR2. When viewed in FIG. 1, the first side SD1 may be disposed at a left side of the third side SD3, and the second side SD2 may be disposed at an upper side of the fourth side SD4. The first side SD1 and the second side SD2 include a point where the first side SD1 and the second side SD2 are joined. This point may be defined as a first edge EG1. The second side SD2 and the third side SD3 include a point where the second side SD2 and the third side SD3 are joined. This point may be defined as a second edge EG2. The third side SD3 and the fourth side SD4 include a point where the third side SD3 and the fourth side SD4 are joined. This point may be defined as a third edge EG3. The fourth side SD4 and the first side SD1 include a point where the fourth side SD4 and the first side SD1 are joined. This point may be defined as a fourth edge EG4.

In an embodiment, the first to fourth sides SD1 to SD4 of the molding material 20 may have a length of about 15 mm or more.

In an embodiment, the molding material may include a reference area RFA and a plurality of recess areas RCA1 to RCA4. The reference area RFA may be defined as an area including a portion of the molding material 20, at which the molding material 20 has a greatest height. Each of the recess areas RCA1 to RCA4 may be defined as an area having a height relatively lower than the height of the reference area RFA.

In an embodiment, the plurality of recess areas RCA1 to RCA4 may include a first recess area RCA1, a second recess area RCA2, a third recess area RCA3, and a fourth recess area RCA4. For example, the first recess area RCA1 may include the first edge EG1, the second recess area RCA2 may include the second edge EG2, the third recess area RCA3 may include the third edge EG3, and the fourth recess area RCA4 may include the fourth edge EG4. In an example embodiment, each recess area may have a planar quadrangular shape.

In an embodiment, a width w1 of each recess area may be equal to or smaller than a length w2 of each side of the molding material 20. For example, the width w1 of the molding material 20 may be equal to or greater than about 50 μm.

In an embodiment, the area occupied by the plurality of recess areas may be about 0.2 to 20% of the area of the molding material when viewed in a plane.

In an embodiment, the first underfill 50 may be formed to surround at least a portion of each side surface of the molding material 20 when viewed in a plane. The first underfill 50 may be formed to cover at least a portion of an upper surface in each of the recess areas RCA1 to RCA4.

In an embodiment, the logic chips 31 and 32 and the memory stacks 41 to 48 may be disposed inside the reference area RFA of the molding material 20.

Referring to FIGS. 1 and 2, in an embodiment, the semiconductor package 1 may include a substrate 10, a first underfill 50 disposed on the substrate 10, an interposer 60 disposed on the first underfill 50, a molding material 20 and a second underfill 70, which are disposed on the interposer 60, logic chips 31 and 32 and memory stacks 41 to 40, which are disposed on the second underfill 70. In addition, the semiconductor package 1 may further include substrate bumps SB, interposer bumps IB, and chip bumps CB. The substrate bumps SB may be disposed under the substrate 10. The interposer bumps IB may be disposed under the interposer 60 while being positioned between the substrate 10 and the interposer 60. The chip bumps CB may be disposed under the logic chips 31 and 32 and the memory stacks 41 to 48. Each chip bump CB may be positioned between a corresponding one of the logic chips 31 and 32 and the interposer 60 or between a corresponding one of the memory stacks 41 to 48 and the interposer 60.

The interposer 60 may be mounted on the substrate 10. The interposer 60 may be selected from a printed circuit board (PCB), a flexible PCB (FPCB), a silicon-based substrate, a ceramic substrate, a glass substrate, and an insulating circuit board. For example, the substrate 10 may be selected from a PCB and an FPCB. In an embodiment, the interposer 60 may be a silicon-based substrate.

The logic chips 31 and 32 and the memory stacks 41 to 48 may be mounted on an upper surface of the interposer 60. The interposer 60 may be a substrate 10 including a redistribution structure. The interposer 60 may electrically connect each of the logic chips 31 and 32 to the substrate 10, and may electrically connect each of the memory stacks 41 to 48 to the substrate 10.

The semiconductor package 1 may include substrate bump pads SP disposed under the substrate 10, and interposer bump pads IP disposed on the substrate 10. The substrate bump pads SP and the interposer bump pads IP may be electrically connected through wirings formed in the substrate 10 in a vertical direction and wirings formed in the substrate 10 in a horizontal direction. The substrate bump pads SP may contact the substrate bumps SB and, as such, may be electrically connected to an external circuit board. The interposer bump pads IP may contact the interposer bumps IB and, as such, may be electrically connected to the interposer 60.

In an embodiment, the semiconductor package 1 may include a first underfill 50 disposed between the substrate 10 and the interposer 60. In an embodiment, the first underfill 50 may be formed throughout the entire lower surface of the interposer 60, except for areas where the interposer bumps IB are formed. The first underfill 50 may surround the interposer bumps IB. In addition, the first underfill 50 may be formed to surround the periphery of the interposer 60 when viewed in a plane. Furthermore, the first underfill 50 may be formed to have a greater height than a lowermost surface of the molding material 20 while being formed to surround the periphery of the molding material 20 when viewed in a plane.

In an embodiment, the first underfill 50 may be formed to overflow up to at least a portion of the molding material 20. In the specification, "overflow" means that a second constituent element disposed under a first constituent element is formed to cover portions of side and upper surfaces of the first constituent element. For example, the first underfill 50 may be disposed to cover at least portions of upper surfaces of recess areas RCA1 to RCA4 in the molding material 20. In accordance with embodiments, the first underfill 50 may be disposed on the recess areas RCA1 to RCA4 of the molding material 20 without being disposed on the reference area RFA.

In an embodiment, portions of the first underfill 50 formed to overflow up to at least portions of the molding material 20 may have a lower height than the reference area RFA of the molding material 20. In an embodiment, the first underfill 50 may be formed to extend up to a portion of the height of a boundary interface between the reference area RFA and each of the recess areas RCA1 to RCA4 and to contact the height portion.

The first underfill 50 may provide bonding force between the substrate 10 and the interposer 60. In an embodiment, the first underfill 50 may include a thermosetting resin.

The second underfill 70 may be formed between the interposer 60 and the logic chips 31 and 32 and between the interposer 60 and the memory stacks 41 to 48 to surround the chip bumps CB. The second underfill 70 may provide bonding force between the interposer 60 and the logic chips 31 and 32 and between the interposer 60 and the memory stacks 41 to 48. In an embodiment, the second underfill 70 may include a thermosetting resin.

In an embodiment, the molding material 20 may be disposed on the interposer 60. In accordance with embodiments, the molding material 20 may be formed such that an upper surface of the interposer 60 is not exposed. For example, the molding material 20 may be formed to overlap with the entire portion of the interposer 60. The molding material 20 may be directly disposed on the interposer 60 to surround side surfaces of the logic chips 31 and 32 and the memory stacks 41 to 48.

In an embodiment, the total height or thickness of the semiconductor package 1 may be about 2.7 to 3.3 mm. For example, the substrate 10 may have a thickness of about 1.5 to 2 mm. The diameter or thickness of the substrate bumps SB may be about 0.2 to 0.8 mm. In an embodiment, the interposer 60 may be thinner than the substrate 10. For example, the interposer 60 may have a thickness of about 0.5 to 1.5 mm. The diameter or thickness of the interposer bumps IB may be about 0.05 to 0.1 mm smaller than that of the substrate bumps SB. In an embodiment, the diameter or thickness of the chip bumps CB may be smaller than the diameter or thickness of the interposer bumps IB. For example, the diameter or thickness of the chip bumps CB may be about 0.02 to 0.05 mm. For example, the thicknesses of the logic chips 31 and 32 and the memory stacks 41 to 48 may be about 0.65 to 0.72 mm. For example, the total thickness including the interposer bumps IB, the interposer 60, the chip bumps CB and the logic chips 31 and 32 may be about 0.8 to 1.0 mm.

Referring to FIGS. 1 to 3, each of the recess areas RCA1 to RCA4 may have a lower height than the reference area RFA. In the following description, the plurality of recess areas RCA1 to RCA4 will be described with reference to the first recess area RCA1. That is, the description of the first recess area RCA1 may be applied to the second to fourth recess areas RCA2 to RCA4. In accordance with embodiments, the contents given with reference to height may be applied to a description to be given with reference to thickness.

For example, as illustrated, the molding material 20 may have a recessed shape in areas adjacent to edges (for example, recess areas RCA1 to RCA4). In another example, the molding material 20 may have a shape including a notch or a trench in the areas adjacent to the edges.

In the specification, the height of each area (for example, each of the areas RFA and RCA1 to RCA4) of the molding material 20 may be defined with reference to the upper surface of the interposer 60 (cf. FIG. 2) (or an upper surface of the substrate 10). In an embodiment, the reference area RFA may have substantially the same height at all positions thereof. In accordance with embodiments, the reference area RFA may have a maximum thickness at the molding material 20. In accordance with embodiments, the plurality of recess areas RCA1 to RCA4 may have a smaller thickness than the reference area RFA.

In an embodiment, a height $h2$ of the first recess area RCA1 may be about 5 to 50% of a height $h1$ of the reference area RFA. For example, the height $h1$ of the molding material 20, which is a height from the upper surface of the interposer 60 in the reference area RFA, may be about 0.5 to 1 mm, and the height $h2$ of the molding material 20, which is a height from the upper surface of the interposer 60 in the first recess area RCA1, may be about 25 to 500 μm. For example, a height difference $h3$ between the reference area RFA and the first recess area RCA1 may be about 500 to 975 μm.

In an example embodiment, the boundary between the first recess area RCA1 and the reference area RFA may be disposed outside a position where an interposer bump IB is formed.

In an embodiment, the first underfill 50 may be disposed to cover at least portions of an outer side surface and an upper surface of the first recess area RCA1. The first underfill 50 may be formed to contact the substrate 10 while having an inclined shape at the outside of the first recess area RCA1. In an example embodiment, the first underfill 50 may include an inclined surface SOL at the periphery thereof. Although the inclined surface SOL is illustrated as being planar, the inclined surface SOL may include a curved surface, without being limited to the illustrated shape.

In an embodiment, a thickness $h4$ of a portion of the first underfill 50 disposed on the upper surface of the first recess area RCA1 (that is, a height from an upper surface of the first underfill 50) may be smaller than the height difference $h3$ between the height $h1$ of the reference area RFA of the molding material 20 and the height $h2$ of the first recess area RCA1 from the upper surface of the interposer 60.

In an embodiment, a surface of the first underfill 50 contacting the upper surface of the first recess area RCA1 may include a portion other than a vertical surface. For example, the surface of the first underfill 50 contacting the upper surface of the first recess area RCA1 may include a horizontal surface (see HS in FIG. 3). The horizontal surface may reduce external stress (for example, tension force) formed in a horizontal direction at a surface of the first underfill 50 contacting the molding material 20. For example, when the surface of the first underfill 50 contacting the upper surface of the first recess area RCA1 is a horizontal surface, most stress acts in a vertical direction on the surface of the first underfill 50 contacting the upper surface of the molding material 20 and, as such, effective stress formed in a horizontal direction may be reduced.

Referring to FIGS. 1 to 4, each of the memory stacks 41 to 48 may include a plurality of stacked memory chips 40a to 40d, through-silicon-vias VIA, and adhesive films AF. The memory chips 40a to 40d in each of the memory stacks 41 to 48 may include non-volatile memory chips such as dynamic random access memory (DRAM), resistive random access memory (RRAM), magneto-resistive random access memory (MRAM), phase-change random access memory (PRAM) and flash memory or various other memory chips.

In the following description, the plurality of memory stacks 41 to 48 will be described with reference to the third memory stack 43. In an embodiment, the lowermost memory chip 40a may include a base die. The base die may include a test logic circuit such as design for test (DFT), joint test action group (JTAG), or memory built-in self-test (MBIST), a signal interface circuit such as PHY, or the like, in place of a memory cell chip. When the lowermost memory chip 40a is a base die, the number of stacked memory chips may be 4 or more. In the drawing, only three memory chips 40b to 40d are shown. The through-silicon vias VIA may be connected to corresponding ones of the chip bumps CB while extending vertically through the memory chips 40a to 40d. The chip bumps CB may contact the chip pads CP formed on the upper surface of the interposer 60, respectively. The chip bumps CB and the through-silicon vias VIA may be vertically aligned. In an embodiment, connecting bumps may be disposed at the through-silicon vias VIA to electrically connect adjacent ones of the memory chips 40a to 40d. Each adhesive film AF may be interposed between adjacent ones of the stacked memory chips 40a to 40d. Each adhesive film AF may include a die attach film (DAF). In an embodiment, each adhesive film AF may include an underfill material.

Hereinafter, a method for manufacturing the semiconductor package 1 in accordance with an example embodiment of the disclosure will be described.

FIGS. 5 to 9 are sectional views schematically showing a method of manufacturing a semiconductor package in accordance with an example embodiment of the disclosure.

Referring to FIGS. 5 to 9, the method for manufacturing the semiconductor package 1 may include a method of forming logic chips and memory stacks on an interposer (S110), forming a molding material (S120), forming a recess area (S130), mounting the resultant structure on a substrate (S140), and forming a first underfill (S150).

First, formation of the logic chips and the memory stacks on the interposer (S110) may be performed. Formation of the logic chips and the memory stacks on the interposer (S110) corresponds to a procedure of disposing logic chips 31 and 32 and memory stacks 41 to 48 on an interposer 60, coating a second underfill 70 between each of the logic chips 31 and 32 and the interposer 60, coating the second underfill 70 between each of the memory stacks 41 to 48 and the interposer 60, and curing the second underfill 70.

Next, formation of the molding material (S120) may be performed. Formation of the molding material (S120) corresponds to a molding process of directly coating a molding material 20a on the interposer 60, and curing the molding material 20a. The molding material 20a may be referred to as an uncured molding material 20a before the curing the molding material 20a is performed and referred to as a cured molding material 20a after the curing the molding material 20a is performed. A package process of mounting the logic chips and the memory stacks on the interposer 60 and forming the molding material 20a on the interposer 60 may be performed. Stiffness of the semiconductor package 1 may be maintained through the molding process. In an example embodiment, an upper surface of the molding material 20a may be flat.

In an embodiment, the molding material 20a may be coated such that the periphery of the molding material 20a corresponds to the periphery of the interposer 60. For example, the molding material 20a may be coated such that the periphery of the molding material 20a has a quadrangular shape when viewed in a plane, as in the shape of the interposer 60. In addition, the molding material 20a may be coated such that upper surfaces of the logic chips 31 and 32 and the memory stacks 41 to 48 are exposed. As a result, after coating of the molding material 20a, an upper surface of the interposer 60 may not be exposed by virtue of the molding material 20a, the logic chips 31 and 32 and the memory stacks.

Meanwhile, when the molding process is performed, occurrence of warpage, degradation of filling of the first underfill 50, formation of cracks between the die and the molding material 20a, etc. may occur due to a coefficient of thermal expansion (CTE) difference between the molding material 20a and elements adjacent thereto or for other reasons.

Figure 7:
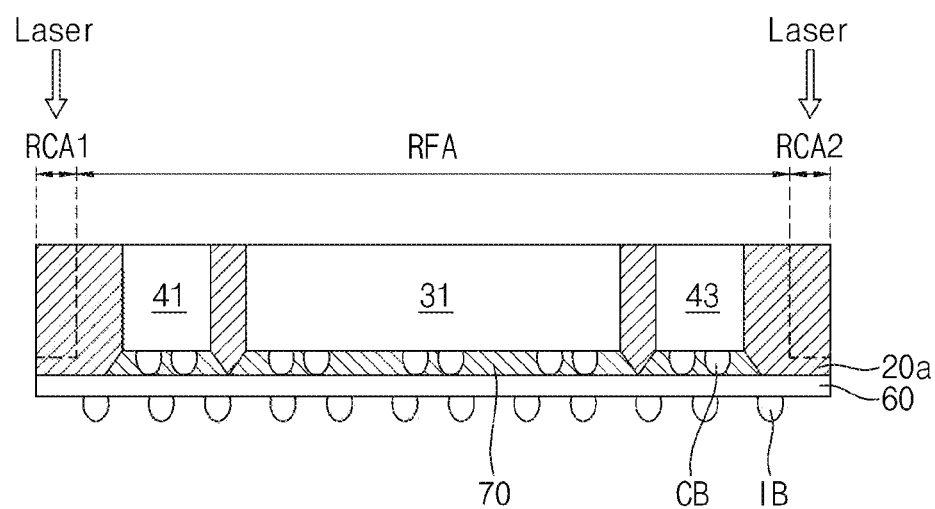
Figure 8:
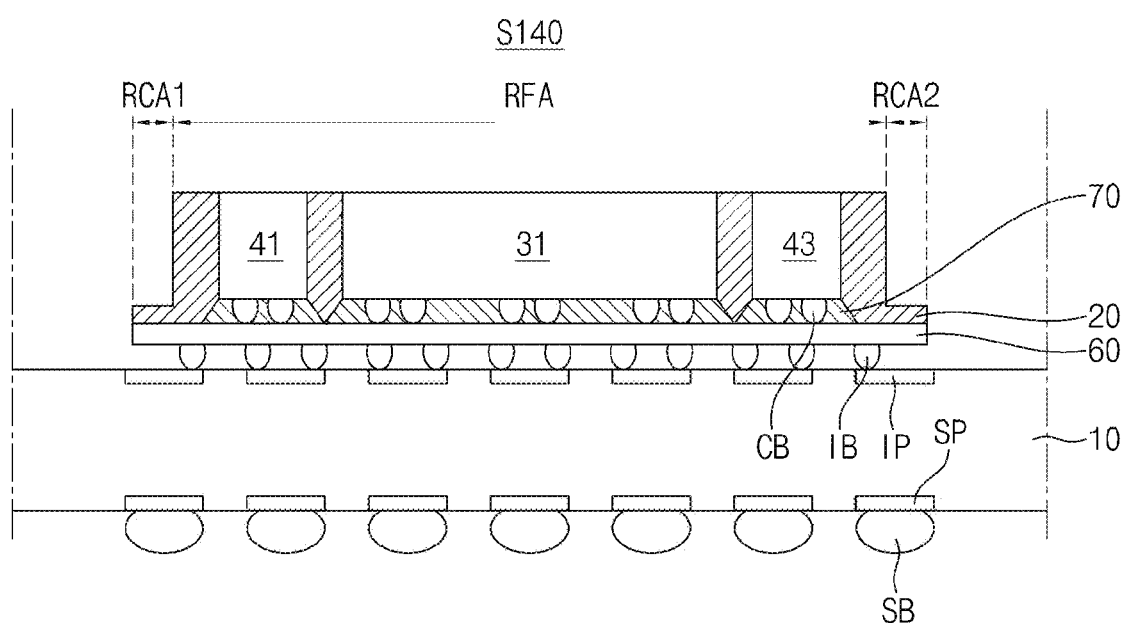
Figure 9:
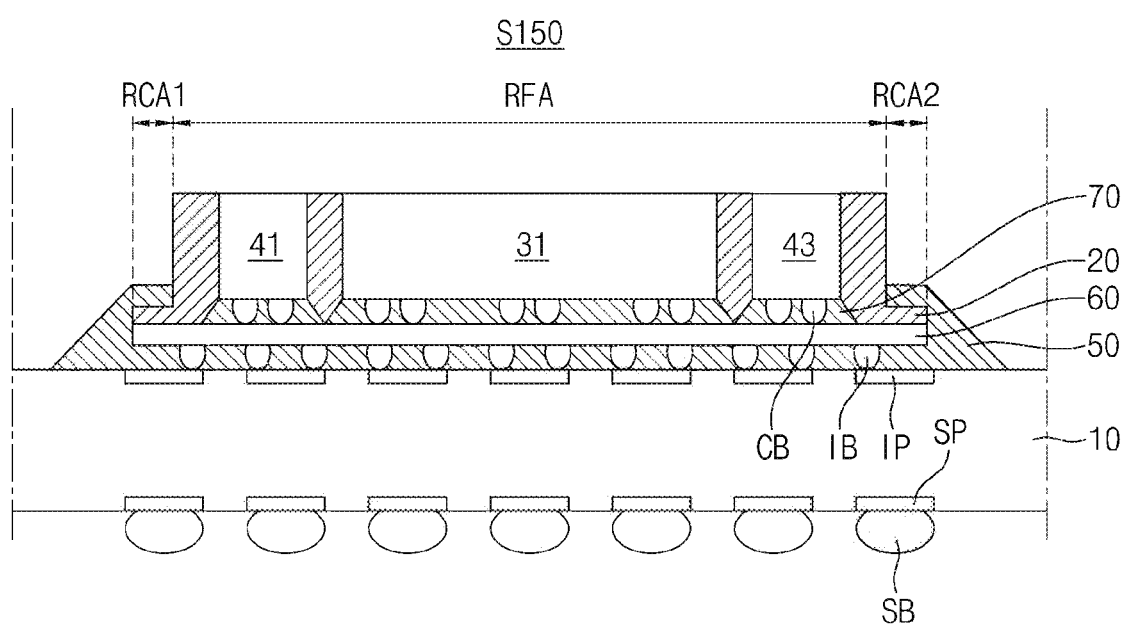

Subsequently, formation of the recess area (S130) may be performed. Formation of the recess area (S130) corresponds to a procedure of forming at least one recess area RCA1 or RCA2 at the molding material 20a. In order to form the recess area (S130), a portion of the molding material 20a may be removed. For example, an upper portion of an area including each edge of the molding material 20a may be partially removed. FIG. 7 illustrates the molding material 20a before forming the at least one recess area and FIG. 8 illustrates the molding material 20 that remains after forming the at least one recess area RCA1 or RCA2 by removing a portion of the molding material 20a.

In an embodiment, the procedure of forming the recess area (S130) may include a laser process. For example, a portion of the molding material 20a may be removed through the laser process to providing the molding material 20. For example, a laser is irradiated onto areas of the molding material 20a where recess areas RCA1 to RCA4 will be formed, respectively, thereby partially removing an upper portion of the molding material 20a to provide the molding material 20.

Subsequently, mounting of the resultant structure on the substrate (S140) may be performed. Mounting of the resultant structure on the substrate (S140) corresponds to a procedure of mounting, on the substrate, the interposer 60 on which the logic chip 31 and the memory stack 41 and 43 are mounted, and the molding material 20 formed, at the upper portion thereof, with the recess areas RCA1 and RCA2 are disposed. Interposer bumps IB disposed under the interposer 60 may contact interposer bump pads IP disposed on a substrate 10 such that the interposer bumps IB correspond to the interposer bump pads IP, respectively.

Thereafter, formation of the first underfill (S150) may be performed. Formation of the first underfill (S150) corresponds to a procedure of coating a first underfill 50 between the substrate 10 and the interposer 60, on the outside of the peripheries of the interposer 60 and the molding material 20, and on the recess areas RCA1 and RCA2 of the molding material 20, and curing the first underfill 50. An underfill material having a desired and/or alternatively predetermined viscosity may be coated between the substrate 10 and the interposer 60, on a side surface of the interposer 60, on the periphery of the molding material 20, and on the recess areas RCA1 and RCA2 of the molding material 20, and may then be cured. Meanwhile, it may be possible to minimize possibility of formation of cracks between the molding material 20 and the first underfill 50 contacting the molding material 20 by forming the first underfill 50 such that the first underfill 50 covers up to an upper surface of a portion of the molding material 20.

Next, a semiconductor package according to another example embodiment of the disclosure or a method for manufacturing the semiconductor package will be described. In the following description, no description will be given of the same constituent elements as those of FIGS. 1 to 9, and identical or similar reference numerals will be designated for the constituent elements.

FIGS. 10 to 16 are projected top views schematically showing semiconductor packages according to example embodiments of the disclosure.

Each embodiment of FIGS. 10 to 16 differs from the embodiment of FIG. 1 in that disposition of at least one logic chip and at least one memory stack is altered, other chips are added, or shape and position of a recess area are altered.

Figure 10:
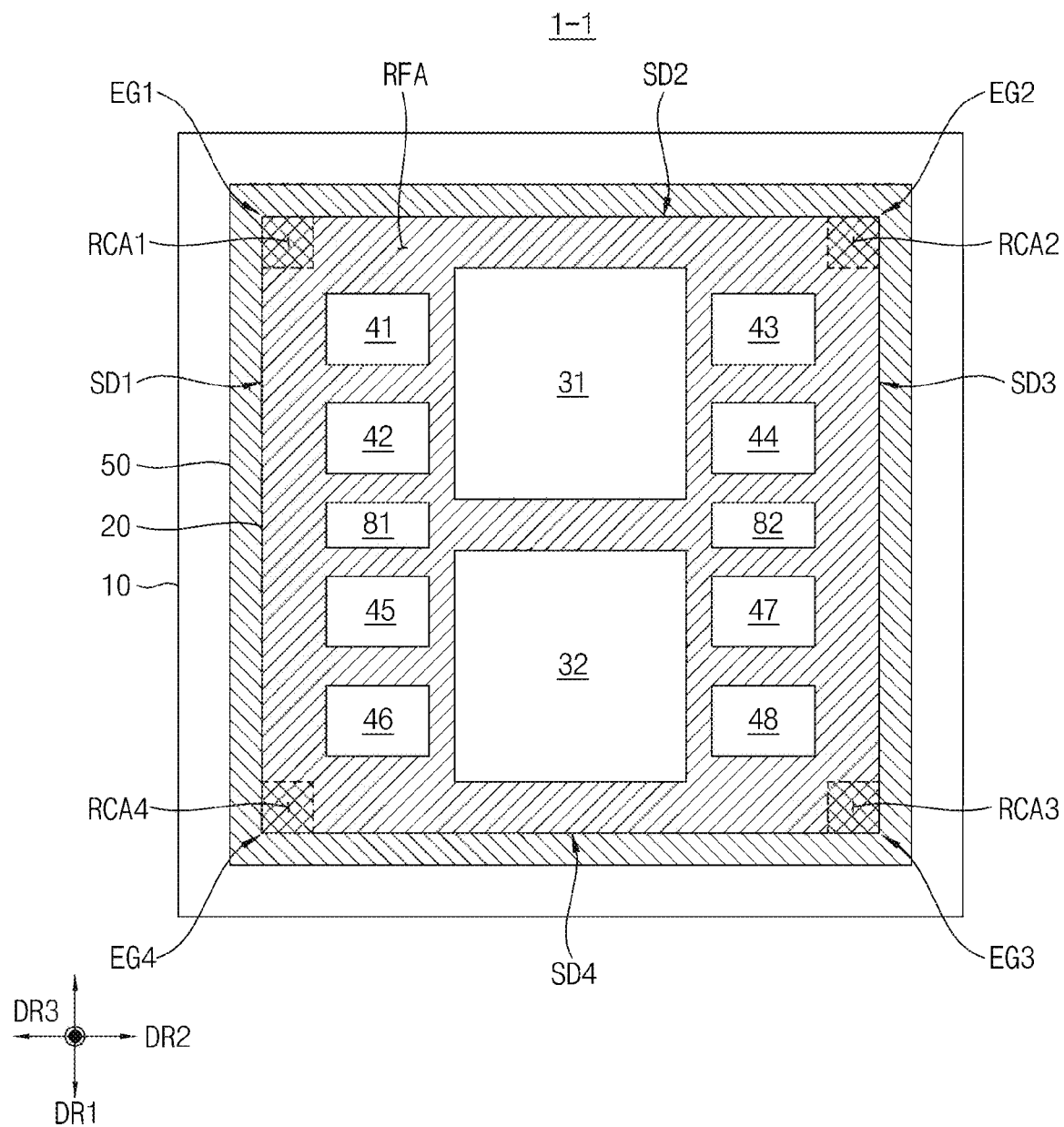
FIGS. 10 to 16 are projected top views schematically showing semiconductor packages according to example embodiments of the disclosure.

Referring to FIG. 10, a semiconductor package 1-1 according to an embodiment may further include stiffening chips 81 and 82.

The stiffening chips 81 and 82 may be disposed to be aligned and overlap, in a second direction DR2, with a boundary area (boundary line) between memory stacks 41 to 44 at an upper side and memory stacks 45 to 48 at a lower side. The stiffening chips 81 and 82 may include a first stiffening chip 81 disposed at a left side and a second stiffening chip 82 disposed at a right side.

The first stiffening chip 81 may be aligned with first, second, fifth and sixth memory stacks 41, 42, 45 and 46 in a first direction DR1. For example, the first stiffening chip 81 may be disposed between the second memory stack 42 and the fifth memory stack 45.

The second stiffening chip 82 may be aligned with third, fourth, seventh and eighth memory stacks 43, 44, 47 and 48 in the first direction DR1. For example, the second stiffening chip 82 may be disposed between the fourth memory stack 44 and the seventh memory stack 47.

In an embodiment, the area of each of the stiffening chips 81 and 82 may be smaller than the area of each of the memory stacks 41 to 48. For example, the length of shorter sides of the stiffening chips 81 and 82 may be smaller than the length of longer sides of the memory stacks 41 to 48 by ½ or less. In accordance with embodiments, the length of longer sides of the stiffening chips 81 and 82 may be smaller than the length of shorter sides of the memory stacks 41 to 48.

Although not clearly shown, the stiffening chips 81 and 82 may have a hexahedral or solid shape. In an embodiment, each of the stiffening chips 81 and 82 may include a solid dummy chip or a plurality of stacked dummy chips. That is, each of the stiffening chips 81 and 82 may include a chip stack. The stiffening chips 81 and 82 may include a portion of a silicon wafer (a silicon die), a portion of a printed circuit board, a metal or ceramic die, an epoxy compound, a solidified polymer resin, an inorganic material such as glass, or other hard materials.

As the semiconductor package 1-1 further includes the stiffening chips 81 and 82. the semiconductor package 1-1 may have excellent resistance against physical stress such as warpage.

Figure 11:
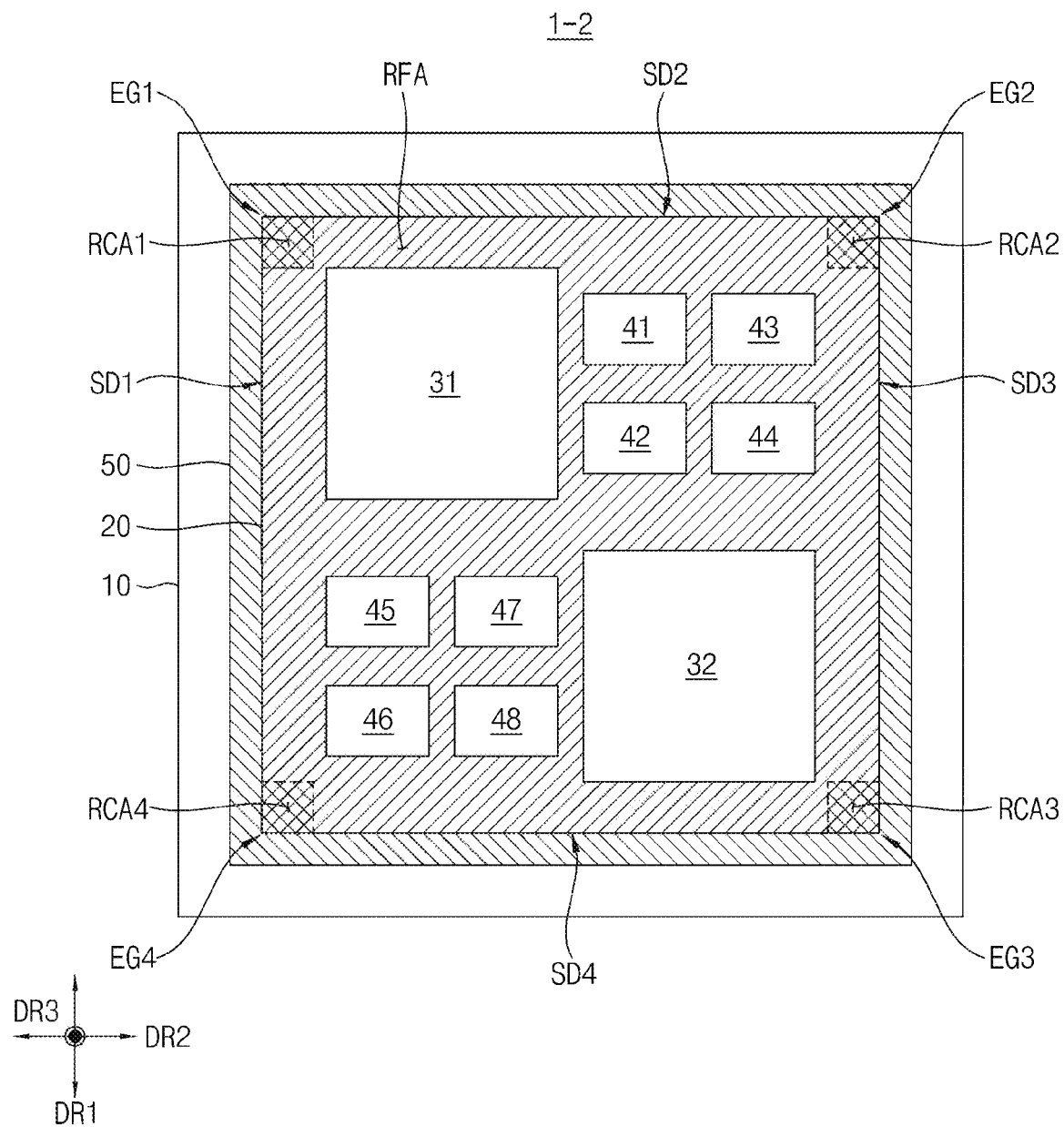

Referring to FIG. 11, in a semiconductor package 1-2 according to an embodiment, with reference to a virtual center of a molding material 20 when viewed in a plane, a first logic chip 31 may be disposed at a left upper side, first to fourth memory stacks 41 to 44 may be disposed at a right upper side, fifth to eighth memory stacks 45 to 48 may be disposed at a left lower side, and a second logic chip 32 may be disposed at a right lower side.

In an embodiment, the first to fourth memory stacks 41 to 44 may be disposed in a 2*2 matrix, and the fifth to eighth memory stacks 45 to 48 may be disposed in a 2*2 matrix.

Figure 12:
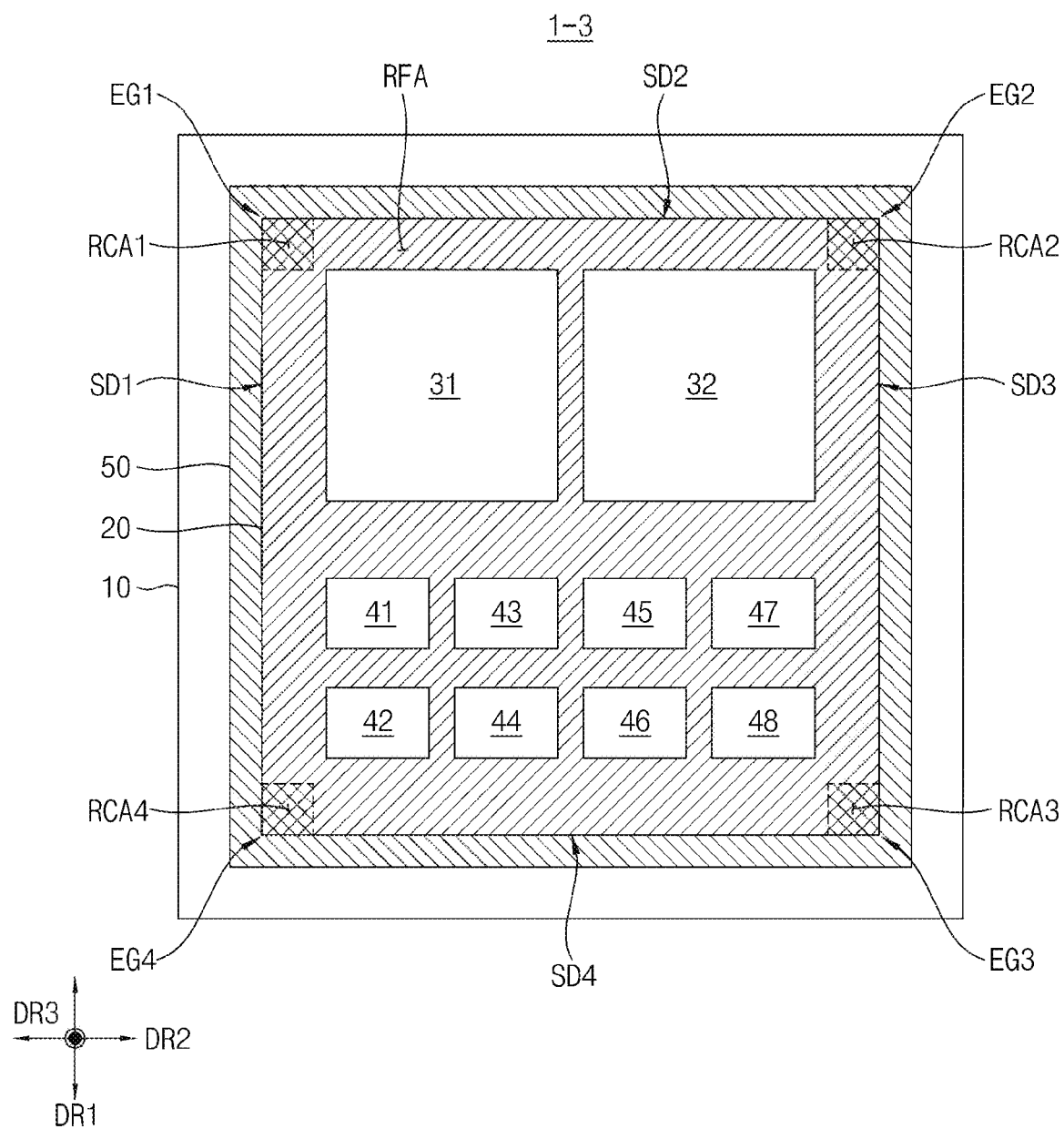

Referring to FIG. 12, in a semiconductor package 1-3 according to an embodiment, logic chips 31 and 32 may be disposed side-by-side at one side, and memory stacks may be disposed at the other side in a matrix (for example, a 4*2 matrix or a 2*4 matrix). For example, with reference to a virtual center of a molding material 20 when viewed in a plane, the first logic chip 31 may be disposed at a left upper side, the second logic chip 32 may be disposed at a right upper side, first to fourth memory stacks 41 to 44 may be disposed at a right lower side, and fifth to eighth memory stacks 45 to 48 may be disposed at a left lower side.

In an embodiment, the first logic chip 31 and the second logic chip 32 may be disposed to be aligned and overlap with each other in the second direction DR2. The first memory stack 41 and the second memory stack 42, the third memory stack 43 and the fourth memory stack 44, the fifth memory stack 45 and the sixth memory stack 46, and the seventh memory stack 47 and the eighth memory stack 48 may be disposed to be aligned and overlap with each other in the first direction DR1 The first memory stack 41, the third memory stack 43, the fifth memory stack 45 and the seventh memory stack 47 may be disposed to be aligned and overlap with one another in the second direction DR2. The second memory stack 42, the fourth memory stack 44, the sixth memory stack 46 and the eighth memory stack 48 may be disposed to be aligned and overlap with one another in the second direction DR2.

Figure 13:
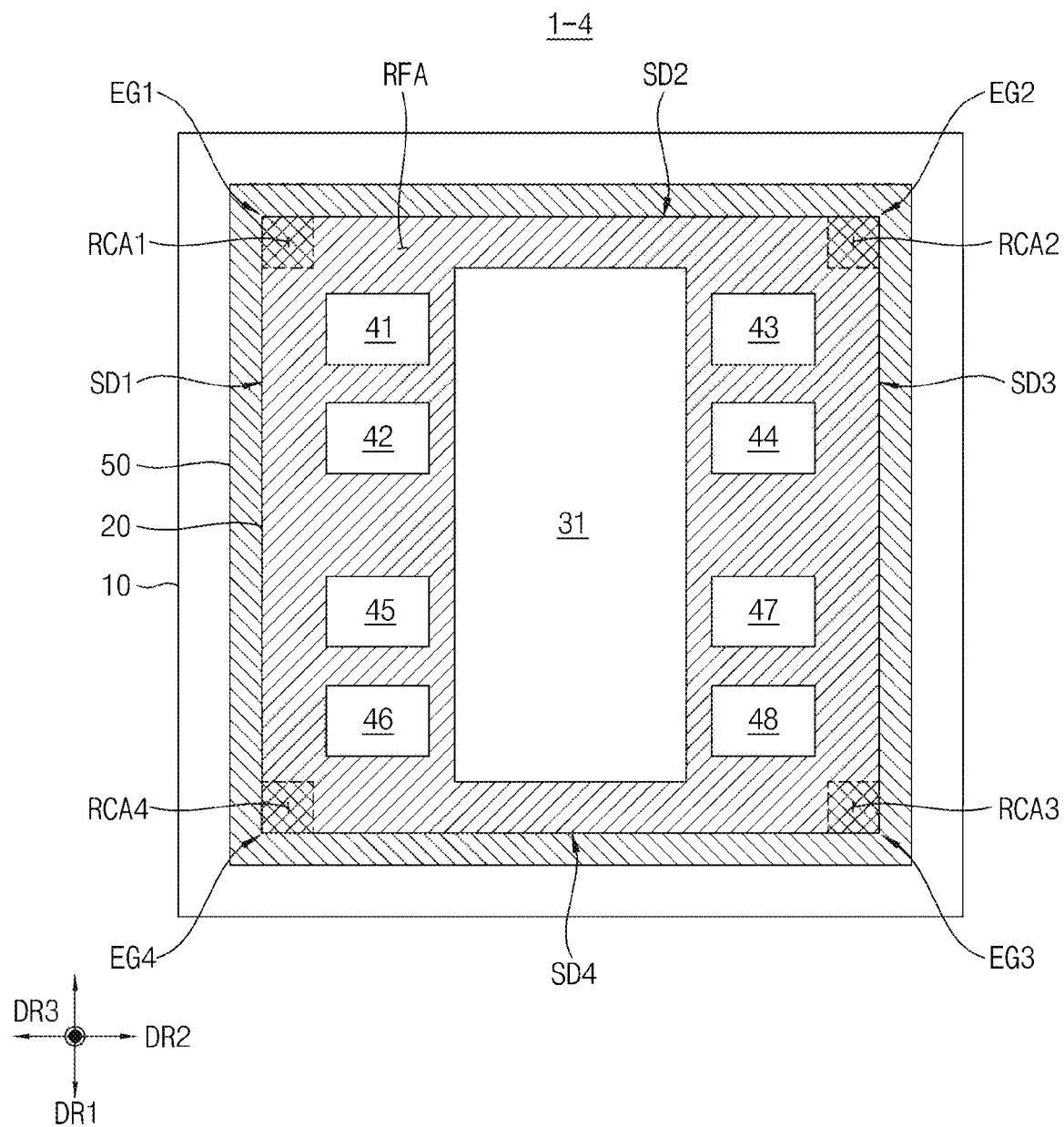

Referring to FIG. 13, a semiconductor package 1-4 according to an embodiment may include one logic chip and a plurality of memory stacks 41 to 48. In an example embodiment, the first to eighth memory stacks 41 to 48 may be symmetrically disposed at opposite sides of a first logic chip 31 while being disposed in parallel.

Figure 14:
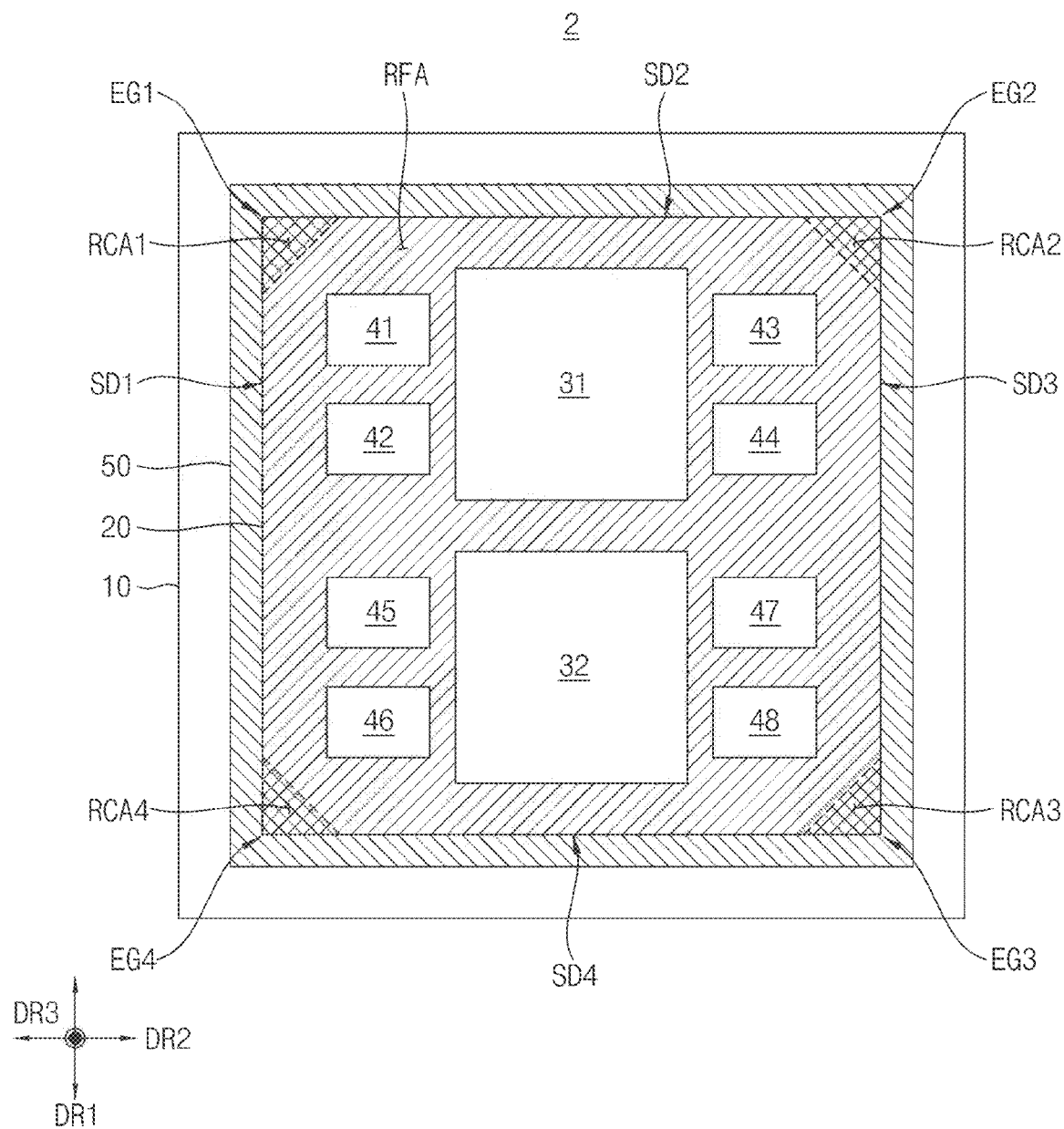

Referring to FIG. 14, in a semiconductor package 2 according to an embodiment, a molding material 20 may include recess areas RCA1 to RCA4 having a triangular shape when viewed in a plane. For example, a first recess area RCA1 may have a right-angled triangular shape formed by a first side SD1, a second side SD2, and a line connecting a point of the first side SD1 and a point of the second side SD2. A second recess area RCA2 may have a right-angled triangular shape formed by the second side SD2, a third side SD3, and a line connecting a point of the second side SD2 and a point of the third side SD3. A third recess area RCA3 may have a right-angled triangular shape formed by the third side SD3, a fourth side SD4, and a line connecting a point of the third side SD3 and a point of the fourth side SD4. A fourth recess area RCA4 may have a right-angled triangular shape formed by the fourth side SD4, the first side SD1, and a line connecting a point of the fourth side SD4 and a point of the first side SD1.

Figure 15:
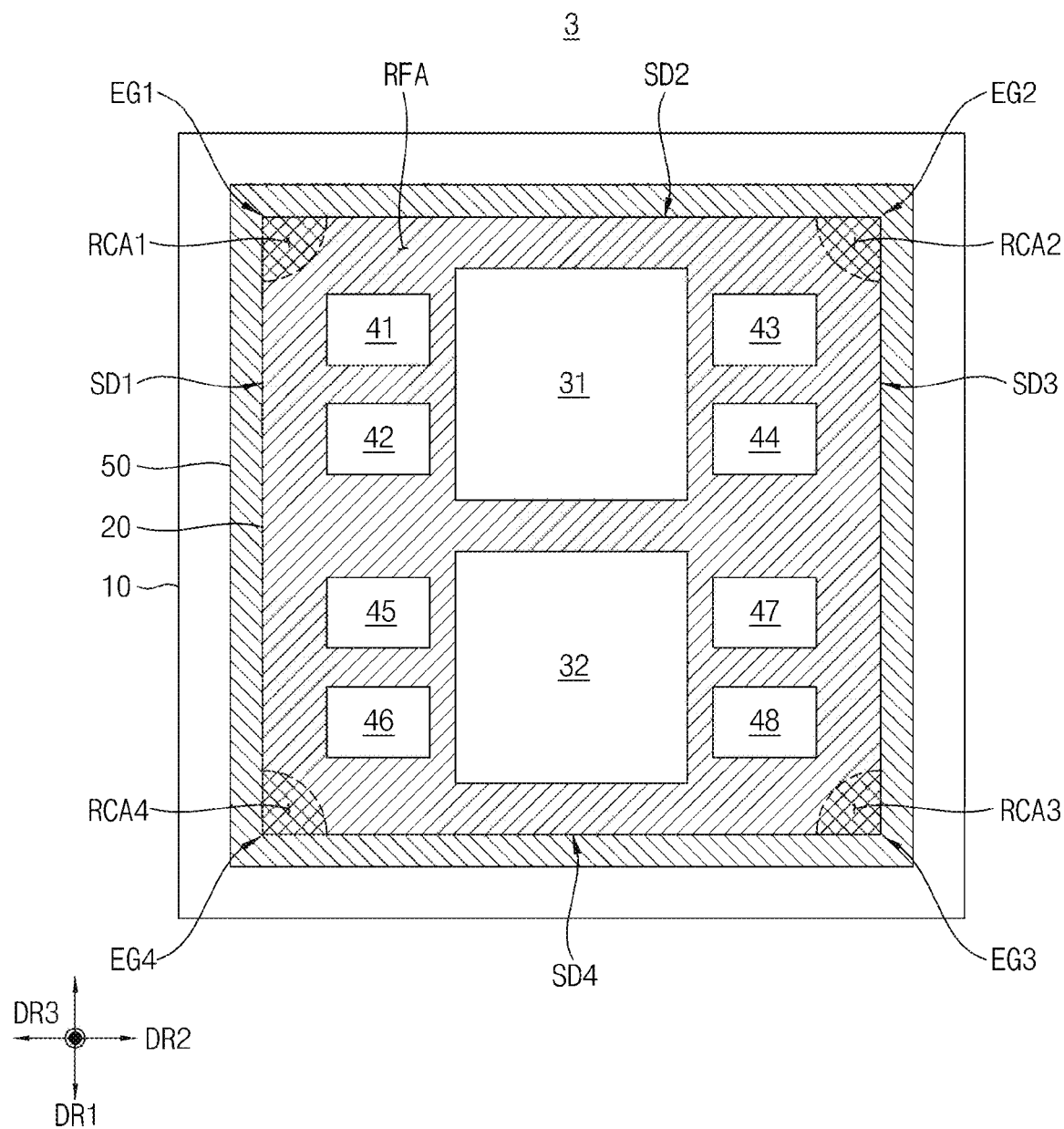

Referring to FIG. 15, in a semiconductor package 3 according to an embodiment, a molding material 20 may include recess areas RCA1 to RCA4 having a shape having two sides and one curved line when viewed in a plane. For example, the recess areas RCA1 to RCA4 may have a sector shape when viewed in a plane. A first recess area RCA1 may have a sector shape formed by a first side SD1, a second side SD2, and a curved line connecting a point of the first side SD1 and a point of the second side SD2. A second recess area RCA2 may have a sector shape formed by the second side SD2, a third side SD3, and a curved line connecting a point of the second side SD2 and a point of the third side SD3. A third recess area RCA3 may have a sector shape formed by the third side SD3, a fourth side SD4, and a curved line connecting a point of the third side SD3 and a point of the fourth side SD4. A fourth recess area RCA4 may have a sector shape formed by the fourth side SD4, the first side SD1, and a curved line connecting a point of the fourth side SD4 and a point of the first side SD1.

Figure 16:
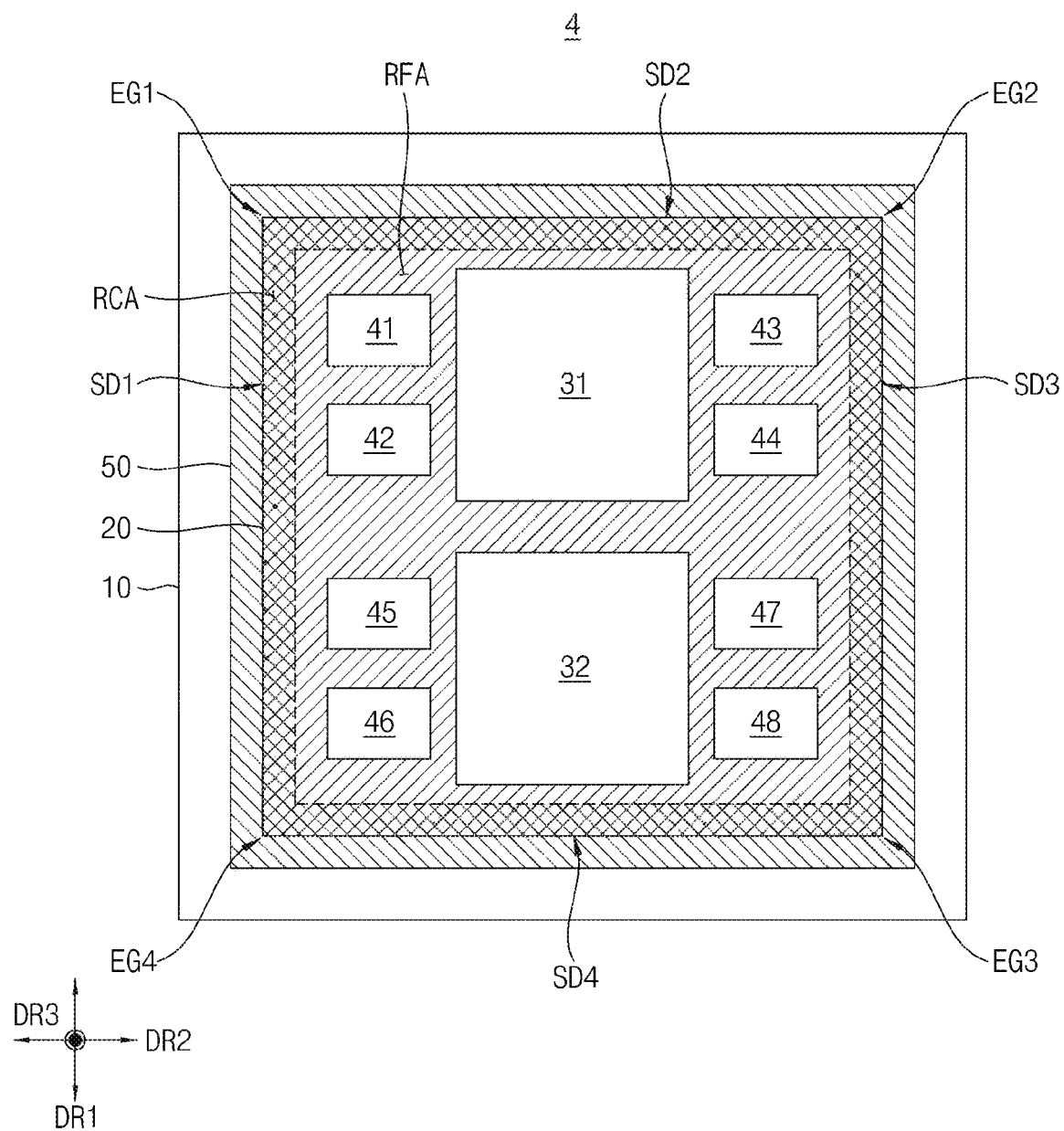

Referring to FIG. 16, in a semiconductor package 4 according to an embodiment, a molding material 20 may include one recess area RCA having a quadrangular frame shape. The recess area RCA may include first to fourth edges EG1 to EG4 of the molding material 20 and first to fourth sides SD1 to SD4 of the molding material 20.

Figure 17:
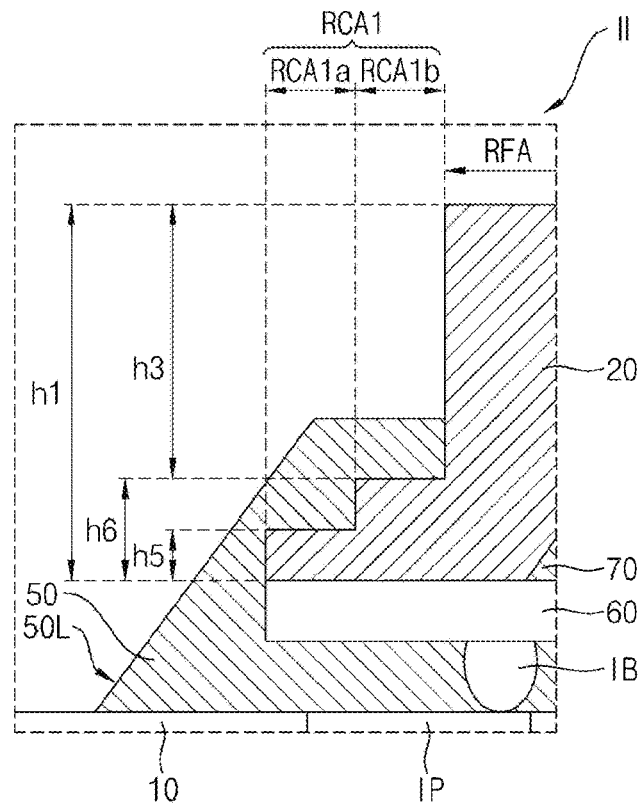
FIGS. 17 to 19 are views schematically showing cross-sections of portions of semiconductor packages according to example embodiments of the disclosure, respectively.
Figure 18:
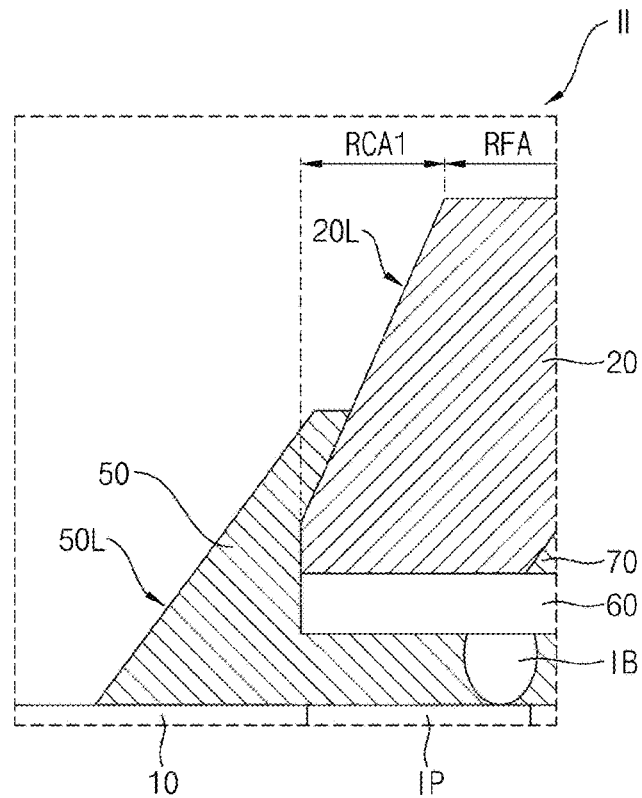
Figure 19:
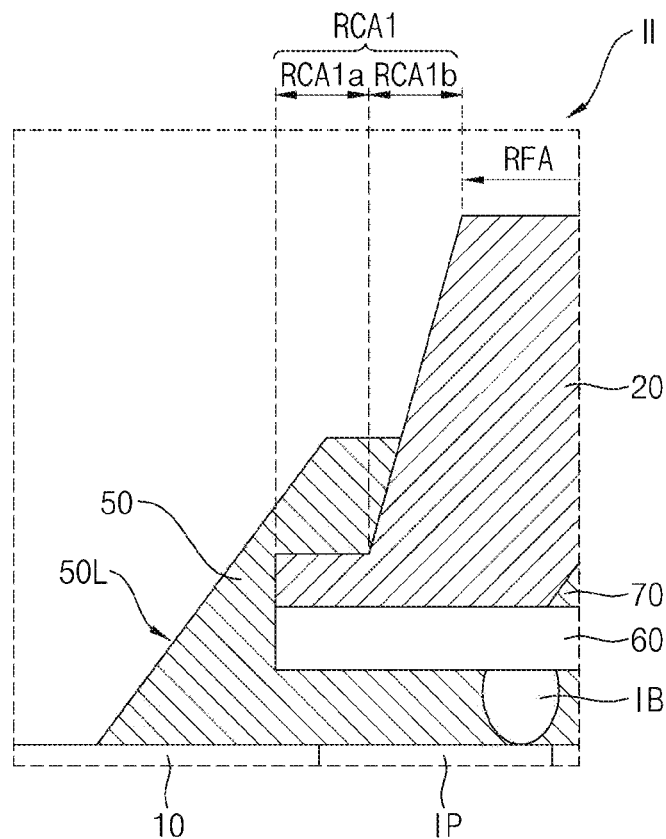

FIGS. 17 to 19 are views schematically showing cross-sections of portions of semiconductor packages according to example embodiments of the disclosure, respectively.

Each embodiment of FIGS. 17 to 19 differs from the embodiment of FIG. 3 in that cross-sectional shapes of recess areas RCA1 to RCA4 are altered. The following description will be given with reference to a first recess area RCA1.

Referring to FIG. 17, in an embodiment, the first recess area RCA1 may include a first sub-area RCA1*a* and a second sub-area RCA1*b*, which have different heights. For example, the first sub-area RCA1*a* may be an area disposed outside the second sub-area RCA1b. A height h5 of the first sub-area RCA1a may be lower than a height h6 of the second sub-area RCA1b. For example, the height h6 of the second sub-area RCA1b may be lower than a height h1 of a reference area RFA. In accordance with embodiments, the height h6 of the second sub-area RCA1b may be about two times the height h5 of the first sub-area RCA1a.

A molding material 20 may overflow up to the first sub-area RCA1a and the second sub-area RCA1b.

Referring to FIG. 18, in an embodiment, the first recess area RCA1 may include an inclined surface 20L. A molding material 20 may overflow up to a portion of the inclined surface 20L of the first recess area RCA1.

Referring to FIG. 19, in an embodiment, the first recess area RCA1 may include a first sub-area RCA1a and a second sub-area RCA1b, which have different heights, and the second sub-area RCA1b, which is disposed inside the first sub-area RCA1a, may include an inclined surface.

A molding material 20 may overflow up to the first sub area RCA1a and a portion of an inclined surface 20L of the second sub-area RCA1b.

Figure 20:
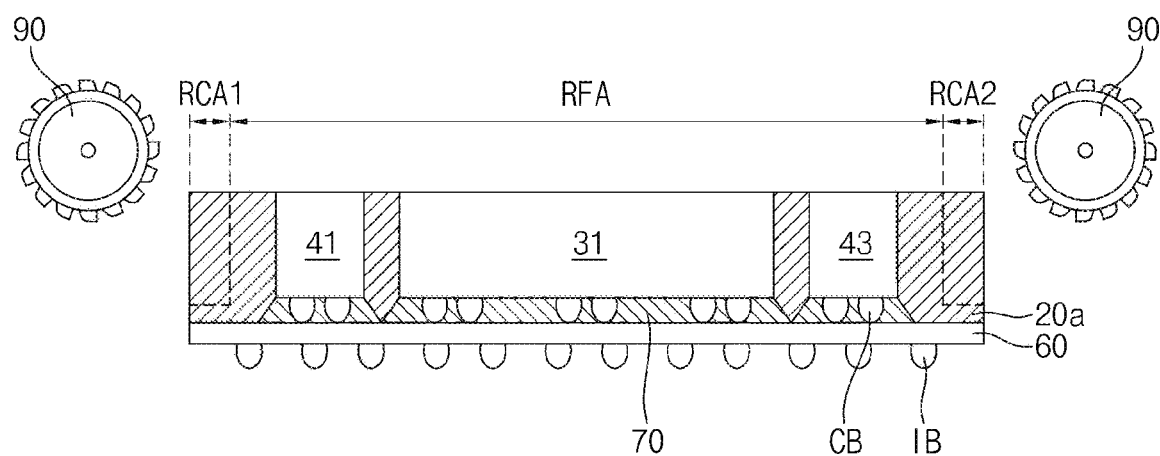
FIG. 20 is a sectional view schematically showing one procedure in a method for manufacturing a semiconductor package in accordance with an example embodiment of the disclosure.

FIG. 20 is a sectional view schematically showing one procedure in a method for manufacturing a semiconductor package in accordance with an example embodiment of the disclosure.

Referring to FIG. 20, the embodiment differs from the embodiment of FIG. 7 in that, in a procedure of forming recess areas (S130-1), recess areas RCA1 to RCA4 are formed through a sawing process.

In an embodiment, portions of edges of a cured molding material 20 may be removed using a cutting member 90 having a desired and/or alternatively predetermined strength. For example, an upper portion of the molding material 20 may be partially removed by physically removing areas of the molding material 20, at which the recess areas RCA1 to RCA4 will be formed, using the cutting member 90, which is rotatable.

In accordance with example embodiments of the disclosure, effective stress formed in a horizontal direction between a molding material and an underfill may be reduced and, as such, possibility of damage to the resultant semiconductor package may be reduced.

While embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
a substrate;
an interposer on the substrate;
a first underfill between the substrate and the interposer;
at least one logic chip and at least one memory stack on the interposer; and
a molding material on the interposer while surrounding a side surface of the at least one logic chip and a side surface of the at least one memory stack,
the molding material including areas having different heights, and
a region of the first underfill covering a portion of the molding material such that the region of the first underfill extends over an upper surface of the portion of the molding material and over an upper surface of a portion of the interposer,
the upper surface of the portion of the molding material being opposite a lower surface of the portion of the molding material, and
the lower surface of the portion of molding material being on the upper surface of the interposer, wherein
the molding material comprises a reference area and at least one recess area,
a height of the at least one recess area is lower than a height of the reference area,
the at least one recess area is outside the reference area,
the first underfill overflows up to the at least one recess area,
the first underfill comprises a first horizontal surface contacting an upper surface of the at least one recess area and a second horizontal surface, the second horizontal surface being parallel to the first horizontal surface and opposite the first horizontal surface.

2. The semiconductor package according to claim 1, wherein the height of the at least one recess area is 5 to 50% of the height of the reference area.

3. The semiconductor package according to claim 1, wherein a thickness of the first underfill on the recess area is smaller than a height difference between the reference area and the at least one recess area.

4. The semiconductor package according to claim 1, wherein the at least one logic chip and the at least one memory stack are inside the reference area.

5. The semiconductor package according to claim 1, wherein each of the at least one recess area comprises a plurality of sub-areas having different heights.

6. The semiconductor package according to claim 1, wherein the recess area comprises an inclined surface.

7. The semiconductor package according to claim 1, wherein
the reference area has a maximum height with reference to the upper surface of the interposer;
the maximum height is 0.5 mm to 1 mm with reference to the upper surface of the interposer; and
the height of the recess area is 25 μm to 500 μm with reference to the upper surface of the interposer.

8. The semiconductor package according to claim 1, wherein the first underfill comprises an inclined surface at a periphery thereof.

9. The semiconductor package according to claim 1, further comprising:
a second underfill, wherein
the second underfill is between each of the at least one logic chip and the interposer or the second underfill is between each of the at least one memory stack and the interposer.

10. The semiconductor package according to claim 1, wherein the molding material comprises an epoxy molding compound (EMC).

11. A semiconductor package comprising:
at least one logic chip on an interposer;
a plurality of memory stacks on the interposer;
a molding material surrounding side surfaces of the at least one logic chip and the plurality of memory stacks,
the molding material including a reference area and at least one recess area,
the reference area includes a portion having a maximum height, and
a height of the at least one recess area being lower than the maximum height of the portion of the reference area,
the molding material, when viewed in a plane, including a plurality of sides and a plurality of edges, each of the plurality of edges being defined by two adjacent ones of the plurality of sides, and
the at least one recess area including the plurality of edges; and
an underfill surrounding a periphery of the molding material while overlapping an upper surface of a portion of the molding material and an upper surface of a portion of the interposer,
the upper surface of the portion of the molding material being opposite a lower surface of the portion of the molding material, and
the lower surface of the portion of molding material being on the upper surface of the interposer, wherein
the molding material has a quadrangular shape,
the quadrangular shape comprises four sides and four edges when viewed in a plane,
the quadrangular shape comprises four recess areas spaced apart from each other such that the at least one recess area of the molding material includes the four recess areas,
the recess areas comprise the edges, respectively, and
an area occupied by the four recess areas is 0.2% to 20% of an area of the molding material when viewed in a plane.

12. The semiconductor package according to claim 11, wherein the underfill is on the at least one recess area without being on the reference area.

13. The semiconductor package according to claim 11, wherein each of the four recess areas has a width in a range of 50 μm or more, provided the width of each of the four recess areas is less than a length of each side of the molding material among the four sides of the molding material.

14. The semiconductor package according to claim 11, wherein some memory stacks among the plurality of memory stacks are disposed in parallel and symmetrically disposed with respect to a corresponding logic chip among the at least one logic chip.

15. A semiconductor package comprising;
a substrate;
an interposer on the substrate;
an underfill between the substrate and the interposer;
a logic chip on the interposer;
a first memory stack and a second memory stack on the interposer,
the first memory stack and the second memory stack being disposed symmetrically with respect to the logic chip while being disposed in parallel; and
a molding material on the interposer while surrounding side surfaces of the logic chip, the first memory stack, and the second memory stack,
the molding material including a reference area, a first recess area, and a second recess area that include bottom surfaces level with each other,
the first recess area and the second recess area having heights lower than a height of the reference area, and
the underfill overlapping the first recess area and the second recess area on a side surface of the molding material and the underfill overlapping an upper surface of the molding material on the first recess area and the second recess area, and
a height of the underfill being higher than the height of the first recess area and lower than the height of the reference area, wherein
the upper surface of the molding material is opposite a lower surface of the molding material, and
the lower surface of the molding material is on the interposer.

16. The semiconductor package according to claim 15, wherein the underfill extends up to a portion of a height of a boundary interface between the reference area and each of the first recess area and the second recess area such that the underfill contacts the portion of the height of the boundary interface.

* * * * *